United States Patent
Varughese et al.

(10) Patent No.: US 10,666,277 B2
(45) Date of Patent: May 26, 2020

(54) METHODS AND DEVICES FOR INPUT SIGNAL CONVERSION SIMULATION

(71) Applicant: Georgia Tech Research Corporation, Atlanta, GA (US)

(72) Inventors: Siddharth Jacob Varughese, Atlanta, GA (US); Jerrod Scott Langston, Atlanta, GA (US); Stephen E. Ralph, Atlanta, GA (US); Varghese Antony Thomas, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 16/519,510

(22) Filed: Jul. 23, 2019

(65) Prior Publication Data

US 2020/0028517 A1    Jan. 23, 2020

Related U.S. Application Data

(60) Provisional application No. 62/701,869, filed on Jul. 23, 2018.

(51) Int. Cl.
*H03M 1/06* (2006.01)
*H04B 1/40* (2015.01)
(Continued)

(52) U.S. Cl.
CPC ...... *H03M 1/0626* (2013.01); *G06F 9/45508* (2013.01); *H04B 1/40* (2013.01); *H04B 10/40* (2013.01); *G06F 7/556* (2013.01)

(58) Field of Classification Search
CPC ...... H03M 1/0626; H03M 1/00; H03M 1/001; H03M 1/06; H03M 1/0602; H03M 1/0617; H03M 13/01; H03M 13/0155; G06F 9/45508; G06F 7/556; H04B 1/40; H04B 10/40; G06J 1/00
See application file for complete search history.

(56) References Cited

U.S. PATENT DOCUMENTS 7,173,551 B2 *   2/2007   Vrazel ................. G11C 27/02
                                               341/144
7,307,569 B2 * 12/2007   Vrazel ................. H03M 1/1265
                                               341/144

(Continued)

*Primary Examiner* — James M Perez
(74) *Attorney, Agent, or Firm* — Troutman Sanders LLP; Ryan A. Schneider

(57) ABSTRACT

A method for simulating and optimizing a digital to analog converter is disclosed. The method may include receiving a plurality of digital words. The method may also include determining an effective number of bits, a respective amplitude and a first amplitude correction amount for each digital word. Further, the first amplitude correction amount may be applied to each respective amplitude to generate respective first corrected amplitudes. A timing uncertainty may be determined which may be used to determine a second amplitude correction for each digital word. The second amplitude correction may be applied to each of the respective first corrected amplitudes to generate respective second corrected amplitudes. Next, a representation of an analog signal may be generated based in part on the second corrected amplitudes. Finally, a filter may be applied to the representation of the analog signal and then the representation of the analog signal is outputted.

21 Claims, 12 Drawing Sheets

(51) Int. Cl.
*G06F 9/455* (2018.01)
*H04B 10/40* (2013.01)
*G06F 7/556* (2006.01)

(56) References Cited

U.S. PATENT DOCUMENTS

| | | | | |
|---|---|---|---|---|
| 7,323,945 | B2* | 1/2008 | Cyr | H03F 3/195 |
| | | | | 331/16 |
| 7,482,887 | B2* | 1/2009 | Cyr | H03F 3/4521 |
| | | | | 331/108 C |
| 7,580,684 | B2* | 8/2009 | Cyr | H03B 5/1215 |
| | | | | 455/75 |
| 8,352,232 | B2* | 1/2013 | Han | G06F 30/23 |
| | | | | 703/14 |
| 9,088,293 | B1* | 7/2015 | D'Souza | H03M 1/0836 |
| 9,130,586 | B1* | 9/2015 | Raz | H03M 1/662 |
| 9,654,128 | B2* | 5/2017 | Pagnanelli | H03M 1/0626 |
| 9,837,990 | B1* | 12/2017 | Pagnanelli | H03M 3/414 |
| 9,945,901 | B1* | 4/2018 | Otte | G01R 31/2851 |
| 10,014,836 | B1* | 7/2018 | Gorecki | H03G 1/007 |
| 10,277,210 | B1* | 4/2019 | Rhew | H03M 1/0836 |
| 10,284,145 | B2* | 5/2019 | Sun | H03F 1/086 |
| 10,355,706 | B1* | 7/2019 | Stein | H03M 1/1085 |
| 10,409,934 | B1* | 9/2019 | Grant | G06F 30/39 |
| 10,461,764 | B1* | 10/2019 | Paro Filho | H03M 1/1033 |
| 2002/0041247 | A1* | 4/2002 | Steensgaard-Madsen | |
| | | | | H03M 1/145 |
| | | | | 341/156 |
| 2002/0167693 | A1* | 11/2002 | Vrazel | G11C 27/02 |
| | | | | 398/27 |
| 2004/0105462 | A1* | 6/2004 | Kim | H03M 1/0675 |
| | | | | 370/466 |
| 2004/0247042 | A1* | 12/2004 | Sahlman | H03F 1/3247 |
| | | | | 375/297 |
| 2005/0212604 | A1* | 9/2005 | Cyr | H03F 3/4521 |
| | | | | 331/16 |
| 2005/0227627 | A1* | 10/2005 | Cyr | H03B 5/1265 |
| | | | | 455/67.11 |
| 2005/0261797 | A1* | 11/2005 | Cyr | H01L 24/48 |
| | | | | 700/121 |
| 2007/0222285 | A1* | 9/2007 | Ribbens | B60T 8/1703 |
| | | | | 303/139 |
| 2007/0222654 | A1* | 9/2007 | Vrazel | H03M 1/1265 |
| | | | | 341/144 |
| 2009/0079524 | A1* | 3/2009 | Cyr | H01L 24/48 |
| | | | | 334/78 |
| 2009/0091958 | A1* | 4/2009 | Kao | G01R 31/2848 |
| | | | | 363/84 |
| 2012/0280844 | A1* | 11/2012 | Abe | H04B 10/60 |
| | | | | 341/118 |
| 2014/0043177 | A1* | 2/2014 | Pagnanelli | H03M 3/30 |
| | | | | 341/143 |
| 2014/0159931 | A1* | 6/2014 | Redfern | H03M 3/422 |
| | | | | 341/143 |
| 2014/0369451 | A1* | 12/2014 | Wu | H03M 1/164 |
| | | | | 375/349 |
| 2015/0091745 | A1* | 4/2015 | Pagnanelli | H03M 3/468 |
| | | | | 341/143 |
| 2015/0171890 | A1* | 6/2015 | Pagnanelli | H03M 3/468 |
| | | | | 341/143 |
| 2016/0072520 | A1* | 3/2016 | Pagnanelli | H03M 3/468 |
| | | | | 341/143 |
| 2016/0147920 | A1* | 5/2016 | Goulkhah | G06F 11/261 |
| | | | | 703/21 |
| 2016/0322982 | A1* | 11/2016 | Pagnanelli | H03M 1/0626 |
| 2016/0373125 | A1* | 12/2016 | Pagnanelli | H03M 3/404 |
| 2017/0170838 | A1* | 6/2017 | Pagnanelli | H03L 7/191 |
| 2017/0201268 | A1* | 7/2017 | Sharma | H03M 1/1245 |
| 2017/0353337 | A1* | 12/2017 | Chakraborty | H04B 1/30 |
| 2018/0198661 | A1* | 7/2018 | Palmers | H04L 27/2627 |
| 2018/0309408 | A1* | 10/2018 | Sun | H03F 1/086 |
| 2018/0323798 | A1* | 11/2018 | Liu | H03M 1/70 |

* cited by examiner

METHODS AND DEVICES FOR INPUT SIGNAL CONVERSION SIMULATION

CROSS-REFERENCE TO RELATED APPLICATION

This application claims the benefit of, and priority under 35 U.S.C. § 119(e) to, U.S. Provisional Patent Application No. 62/701,869, entitled "Digital-to-Analog Converter Model for High Speed Optical Link Simulations," filed Jul. 23, 2018, the contents of which are hereby incorporated by reference herein in their entirety as if fully set forth below.

FIELD OF THE INVENTION

The presently disclosed subject matter relates generally to methods and devices for input signal conversion simulation and, more particularly, to methods and devices for generating a representation of a digital signal or an analog signal from an input signal.

BACKGROUND

Electronic converters such as Analog to Digital Converters (ADCs) and Digital to Analog Converters (DACs) have enabled seamless transitions between the analog and digital domain. Owing to developments of these devices, sophisticated digital signal processing (DSP) techniques can be implemented to improve the performance of many systems. These techniques have proven to be crucial to meet the increasing data rate requirement in optical networks. In the coming years, line rates in excess of 400 Gbps are expected to be deployed to meet the growing traffic requirements.

As these bandwidths increase, new impairments arise that may severely limit the performance of high-speed systems. Therefore, new models are required to simulate such devices in the presence of these new impairments, some of which maybe frequency dependent. These impairments include quantization, timing jitter, bandwidth limitations and noise. Accordingly, there is a need for an improved method and device for accurately simulating a high-speed signal into a representation of an analog or a digital signal.

SUMMARY

Aspects of the disclosed technology include methods and devices for input signal conversion simulation. Consistent with the disclosed embodiments, the methods can include one or more processors, devices, or databases. One exemplary method may include simulating and optimizing a digital to analog converter. The method may include a virtual digital analog converter (VDAC) receiving a representation of a digital signal from a first device. The representation of the digital signal may include a plurality of digital words. The method may also include determining an effective number of bits ($ENoB_{DC}$) of the VDAC based on a noise associated with the VDAC. The noise may be related to a bandwidth of the VDAC. Next, the method may include determining a respective amplitude for each digital word. Further, for each digital word, a first amplitude correction amount according to the $ENoB_{DC}$ of the VDAC may be determined. The first amplitude correction amount may be applied to each respective amplitude to generate respective first corrected amplitudes. Also, the method may include determining a sampling rate of the VDAC. Next, for each digital word, a second amplitude correction amount may be determined based on the timing uncertainty of the VDAC, which may then be applied to each of the respective first corrected amplitudes to generate respective second corrected amplitudes. Further, a representation of an analog signal may be generated based at least in part on the second corrected amplitudes. Then, a filter may be applied to the representation of the analog signal, which may be outputted by the VDAC.

In some embodiments, each of the plurality of digital words has a resolution about equal to a resolution of the hardware bit architecture of the VDAC.

In some embodiments, the representation of the digital signal may include a representation of an electrical signal, an optical signal, a high-resolution digital signal, or a wireless signal.

In some embodiments, the sampling rate is a positive number.

In some embodiments, determining the second amplitude correction amount further may involve determining a time derivative of the representation of the digital signal, and multiplying the sample timing uncertainty and the time derivative of the representation of the digital signal to compute the second amplitude correction amount.

According to some embodiments, the $ENoB_{DC}$ of the VDAC is a positive number.

In some embodiments, ENoB of the VDAC is characterized by the formula:

$$ENoB = ENoB_{DC} + \log_2|H(f)| - \frac{1}{2}\log_2(1 + 6(2^{ENoB_{DC}}\pi f\sigma(\text{the second amplitude correction}))^2 - \frac{1}{2}\log_2\left(\frac{2}{f_s}\int|H(f)|^2 df\right),$$

wherein:
$ENoB_{DC}$ is the ENoB due to the first amplitude correction amount,
$\frac{1}{2}\log_2(1+6(2^{ENoB_{DC}}\pi f\sigma(\text{the second amplitude correction}))^2$ represents a decrease in the ENoB due to the second amplitude correction,
$\log_2|H(f)|$ represents a decrease in the ENoB due to the low-pass filter, and $$\frac{1}{2}\log_2\left(\frac{2}{f_s}\int|H(f)|^2 df\right)$$

represents an increase in the ENoB due to the suppression of noise and distortions by the low-pass filter.

Another exemplary method may include simulating and optimizing an analog to digital converter. The method may include a virtual analog digital converter (VADC) receiving a representation of an analog signal from a first device. The method may also include applying a filter to the representation of the analog signal. Next, the method may determine a sample timing uncertainty of the VADC. Further, the method may determine, for the representation of the analog signal, a first amplitude correction amount based on the sample timing uncertainty of the VADC. The first amplitude correction amount may be applied to the representation of the analog signal. Also, the method may sample the representation of the analog signal at a predetermined sampling rate, to obtain a plurality of digital samples. Each sample may have an amplitude. The method may also include determining an effective number of bits ($ENoB_{DC}$) of the VADC based on a noise associated with the VADC. The noise may be related to a bandwidth of the VADC. Further, the method may determine, for each digital sample, a second amplitude correction amount according to the $ENoB_{DC}$ of the VADC, which may be applied to the plurality of digital samples. Finally, the method may include outputting, by the VADC, the plurality of digital samples as a representation of a digital signal.

According to some embodiments, each of the plurality of digital samples is a respective digital word having a resolution about equal to a resolution of a hardware bit architecture of the ADC.

In some embodiments, the representation of the analog signal may be an optical signal, a wireless signal, a high-resolution digital signal, or an electrical signal.

In some embodiments, the predetermined sampling rate is a positive number.

According to some embodiments, determining the first amplitude correction amount may involve: (i) determining a derivative of the representation of the analog signal; and (ii) multiplying the timing uncertainty and the derivative of the representation of the analog signal to compute the first amplitude correction amount.

In some embodiments, the $ENoB_{DC}$ of the VADC is a positive number.

In some embodiments, the representation of the input signal is described by an oversampled digital signal having an oversampling factor of at least 2.

In some embodiments, the ENoB of the VADC is characterized by the formula:

$$ENoB = ENoB_{DC} + \log_2|H(f)| - \frac{1}{2}\log_2(1 + 6(2^{ENoB_{DC}\sigma f\sigma(\text{the second amplitude correction})})^2),$$

wherein:

$ENoB_{DC}$ is the ENoB characterized by the second amplitude correction, $\frac{1}{2}\log_2(1 + 6(2^{ENoB_{DC}\sigma f\sigma(\text{the second amplitude correction})})^2)$ represents a decrease in the ENoB due to the first amplitude correction, and $\log_2|H(f)|$ represents a decrease in the ENoB due to the low-pass filter.

Further features of the disclosed design, and the advantages offered thereby, are explained in greater detail hereinafter with reference to specific embodiments illustrated in the accompanying drawings, wherein like elements are indicated be like reference designators.

BRIEF DESCRIPTION OF THE DRAWINGS

Reference will now be made to the accompanying drawings, which are not necessarily drawn to scale, are incorporated into and constitute a portion of this disclosure, illustrate various implementations and aspects of the disclosed technology, and, together with the description, serve to explain the principles of the disclosed technology. In the drawings.

DETAILED DESCRIPTION

Some implementations of the disclosed technology will be described more fully with reference to the accompanying drawings. This disclosed technology can be embodied in many different forms, however, and should not be construed as limited to the implementations set forth herein. The components described hereinafter as making up various elements of the disclosed technology are intended to be illustrative and not restrictive. Many suitable components that would perform the same or similar functions as components described herein are intended to be embraced within the scope of the disclosed electronic devices and methods. Such other components not described herein can include, but are not limited to, for example, components developed after development of the disclosed technology.

It is also to be understood that the mention of one or more method steps does not imply that the methods steps must be performed in a particular order or preclude the presence of additional method steps or intervening method steps between the steps expressly identified.

Reference will now be made in detail to exemplary embodiments of the disclosed technology, examples of which are illustrated in the accompanying drawings and disclosed herein. Wherever convenient, the same references numbers will be used throughout the drawings to refer to the same or like parts.

Figure 1:
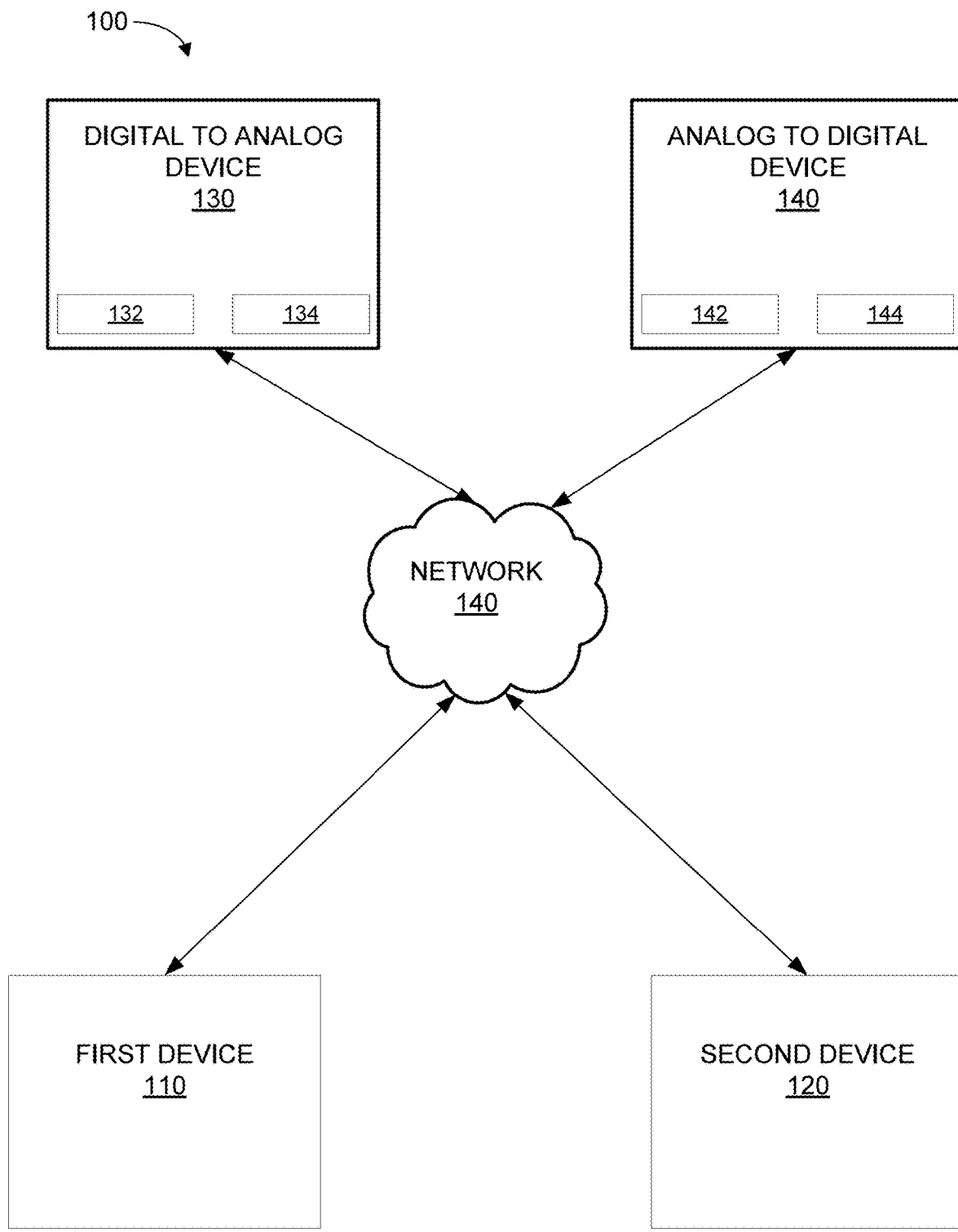
FIG. 1 is a diagram of an example system for input signal conversion simulation and optimization, in accordance with some examples of the present disclosure.

FIG. 1 shows an example environment 100 where certain aspects of the present disclosure may be implemented. The components and arrangements shown in FIG. 1 are not intended to limit the disclosed embodiments as the components used to implement the disclosed processes and features can vary. As shown in FIG. 1, in some implementations the environment 100 may include a first device 110 and a second device 120. The digital to analog (DAC) device 130 may include a processor 132 and a transceiver 134. Similarly, the analog to digital device (ADC) 140 may include a processor 142 and a transceiver 144. The first and second devices 110, 120 can be many different devices for transmitting and/or receiving signals. In some embodiments, the first and second devices are communication devices. In some embodiments, the first and second devices can be virtual communication devices, i.e., simulations of communication devices in a virtual environment on one or more CPUs. As non-limiting examples, the first device 110 and/or the second device 120 may be a personal computer, a laptop computer, a tablet, a desktop computer, a mainframe, and/or the like, or a virtual representation thereof. The network 140 can include a network of interconnected computing devices such as, for example, an intranet, a cellular network, or the Internet. And, while shown as a single device in FIG. 1, the web server 130 can include one or more physical or logical devices (e.g., servers), cloud servers, remote servers, etc. An example computer architecture that may be used to implement the DAC device 130 and/or ADC device 140 may be described below with reference to FIG. 5.

The DAC device 130 may simulate and optimize a representation of a digital signal. The DAC device 130 may begin by receiving a representation of a digital signal from the first device 110. The representation of the digital signal may include a plurality of digital words. Each of the plurality of digital words may have a resolution about equal to a resolution of the hardware bit architecture of the DAC device 130. Further, the representation of the digital signal may be a representation of an electrical signal, an optical signal, a high-resolution digital signal, and/or a wireless signal. Also, the representation of the digital signal may be a representation of an oversampled digital signal having an oversampling factor of at least 2. The DAC device 130 may determine an effective number of bits ($ENoB_{DC}$) of the DAC based on a noise associated with the DAC device 130 and/or a hardware bit architecture of the DAC device 130. The $ENoB_{DC}$ of the DAC device 130 may be a positive number. Also, the noise may be related to a bandwidth of the DAC device 130. Also, the DAC device 130 may determine a respective amplitude for each digital word and also determine, for each digital word, a first amplitude correction amount according to the $ENoB_{DC}$ of the DAC device 130.

Moreover, the DAC device 130 may apply the first amplitude correction amount to each respective amplitude to generate respective first corrected amplitudes. Also, the DAC device 130 may determine a sampling rate of the DAC device 130 and apply a multiple of the sampling rate of the DAC device 130 to each of the first corrected amplitudes. The sampling rate may a positive number. The DAC device 130 may further determine a timing uncertainty of the DAC device 130 and determine, for each digital word, a second amplitude correction amount based on the timing uncertainty of the DAC device 130. Also, the DAC device 130 may apply the second amplitude correction amount to each of the respective first corrected amplitudes to generate respective second corrected amplitudes. The second amplitude correction may be determined by: (i) determining a time derivative of the representation of the digital signal; and (ii) multiplying the sample timing uncertainty and the time derivative of the representation of the digital signal to compute the second amplitude correction amount.

Further, the DAC device 130 may generate a representation of an analog signal based at least in part on the second corrected amplitudes and apply a filter to the representation of the analog signal. The DAC device 130 may output the representation of the analog signal to the first device 110, the second device 120, and/or to another device.

Turning to the ADC device 140, the ADC device 140 may simulate and optimize a representation of an analog signal. The ADC device 140 may receive the representation of an analog signal from the first device 110. The representation of the analog signal may include a representation of an optical signal, a wireless signal, a high-resolution digital signal, and/or an electrical signal. Further, the representation of the analog signal may be described by an oversampled digital signal having an oversampling factor of at least 2. Next, the ADC device 140 apply a filter to the representation of the analog signal. The filter may be a low-pass filter. Also, the ADC device 140 may determine a sample timing uncertainty of the ADC device 140. Further, the ADC device 140 may determine, for the representation of the analog signal, a first amplitude correction amount based on the sample timing uncertainty of the ADC device 140. The ADC device 140 may apply the first amplitude correction amount to the representation of the analog signal. The ADC device 140 may further sample the representation of the analog signal at a predetermined sampling rate, to obtain a plurality of digital samples. Each sample may have an amplitude. The predetermined sampling rate may be a positive number.

Moreover, each of the plurality of digital samples may be a respective digital word having a resolution about equal to a resolution of the hardware bit architecture of the ADC device 140. Also, the ADC device 140 may determine an effective number of bits ($ENoB_{DC}$) of the ADC device 140 based on a noise associated with the ADC device 140 and/or a hardware bit architecture of the ADC device 140. The $ENoB_{DC}$ of the ADC device 140 may be a positive number. The noise may be related to a bandwidth of the ADC device 140. The ADC device 140 may further determine, for each digital sample, a second amplitude correction amount according to the $ENoB_{D}c$ of the ADC device 140. The second amplitude correction may be determined by: (i) determining a time derivative of the representation of the analog signal; and (ii) multiplying the sample timing uncertainty and the time derivative of the representation of the analog signal to compute the second amplitude correction amount. The ADC device 140 may apply the second amplitude correction amount to the plurality of digital samples. Further, the ADC device 140 may output the plurality of digital samples as a representation of a digital signal to the first device 110, the second device 120, and/or another device.

In some embodiments, the ADC and/or DAC disclosed herein can be a virtual ADC (VADC) and/or virtual DAC (VDAC). In other words, the ADC and/or DAC can be simulated in a virtual environment on one or more CPUs. Such embodiments can assist in determining characteristics for a physical ADC and/or DAC for a particular application.

Figure 2:
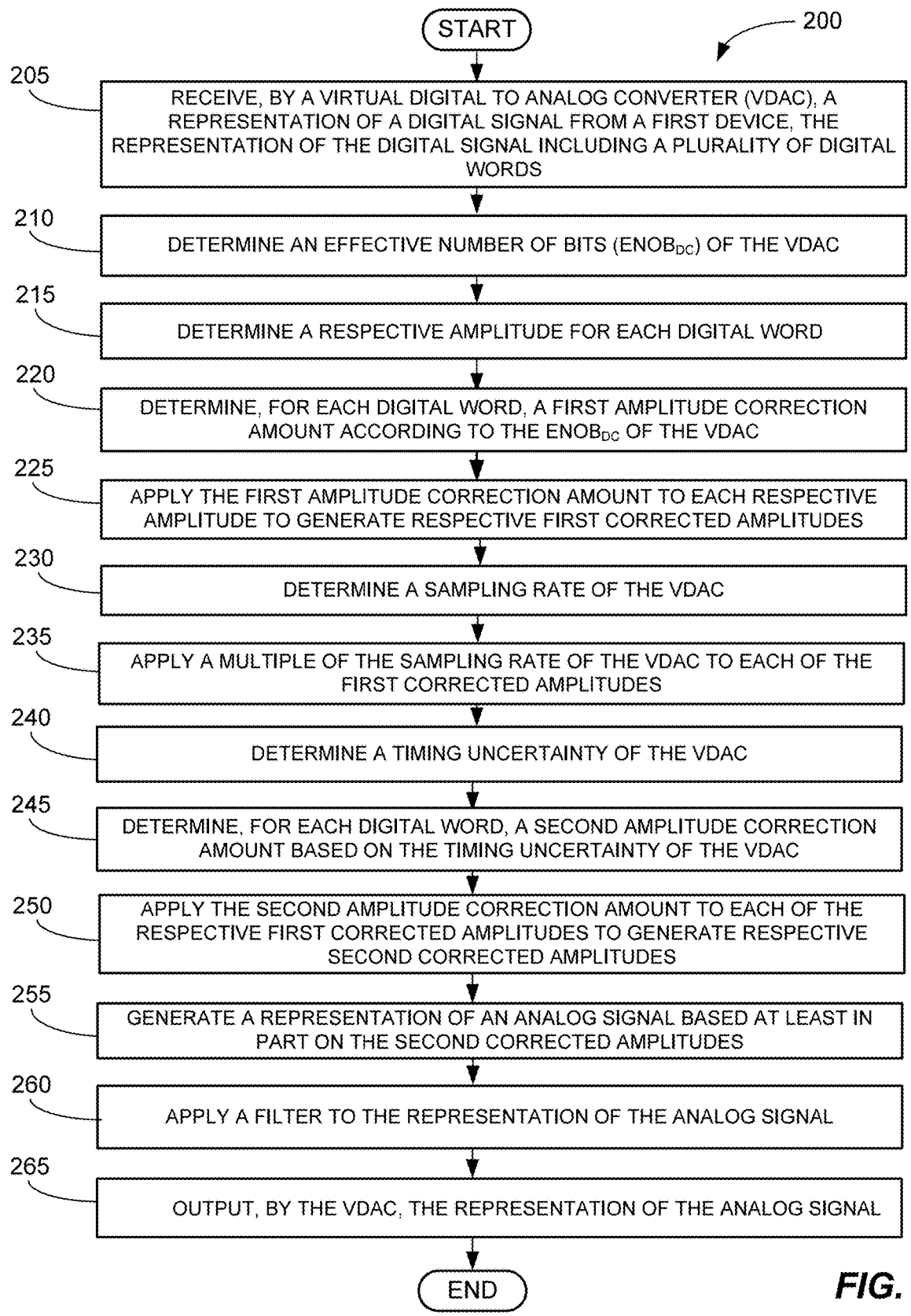
FIG. 2 is an example flow chart of a method for simulating and optimizing a digital to analog converter, in accordance with some examples of the present disclosure.

FIG. 2 shows an example flow chart of a method for simulating and optimizing a digital to analog converter. The method 200 may include modeling the VDAC after, for example, the DAC device 130. At 205, the method may include receiving the representation of the digital signal from the first device 110, which may execute simulation software. As mentioned above, the representation of the digital signal may include a plurality of digital words. At 210, the $ENOB_{DC}$ of the VDAC may be determined based on the noise associated with the VDAC and/or the hardware bit architecture of the VDAC. $ENOB_{DC}$ of the VDAC may be, at most, the hardware bit architecture, however, the $ENOB_{DC}$ of the VDAC may be reduced by the effects of the noise (e.g., thermal noise). The noise may be related to a bandwidth of the VDAC, which may be bandwidth of about 15 to 30 GHz. Therefore, assuming a maximum bit architecture of 8 bits, the $ENOB_{DC}$ of the VDAC may be within the range of about 0 to 8 bits. Further, at 215, the VDAC may determine a respective amplitude for each digital word. At 220, the VDAC may determine, for each digital word, a first amplitude correction amount according to the $ENoB_{DC}$ of the VDAC.

At 225, the first amplitude correction amount may be applied to each respective amplitude to generate respective first corrected amplitudes. Further, at 230, the sampling rate of the VDAC may be determined. At 235, a multiple of the sampling rate of the VDAC may be applied to each of the first corrected amplitudes. The multiple of the sampling rate may be an associated time scale based on the sampling rate of the VDAC. At 240, the timing uncertainty of the VDAC may be determined. For each digital word, based on the timing uncertainty of the VDAC, a second amplitude correction amount may be determined at 245. As an example, the second amplitude correction amount may be in the range of about 0 fs to 800 fs. At 250, the second amplitude correction amount may be applied to each of the respective first corrected amplitudes to generate respective second corrected amplitudes. At 255, the representation of the analog signal may be generated based at least in part on the second corrected amplitudes.

At 260, a filter is applied to the representation of the analog signal. The filter may be a low pass filter having the following values: 5th-order Gaussian; and 20 GHz bandwidth. Finally, at 265, the VDAC may output the representation of the digital signal to the first device 110, second device 120, and/or another device.

Figure 3:
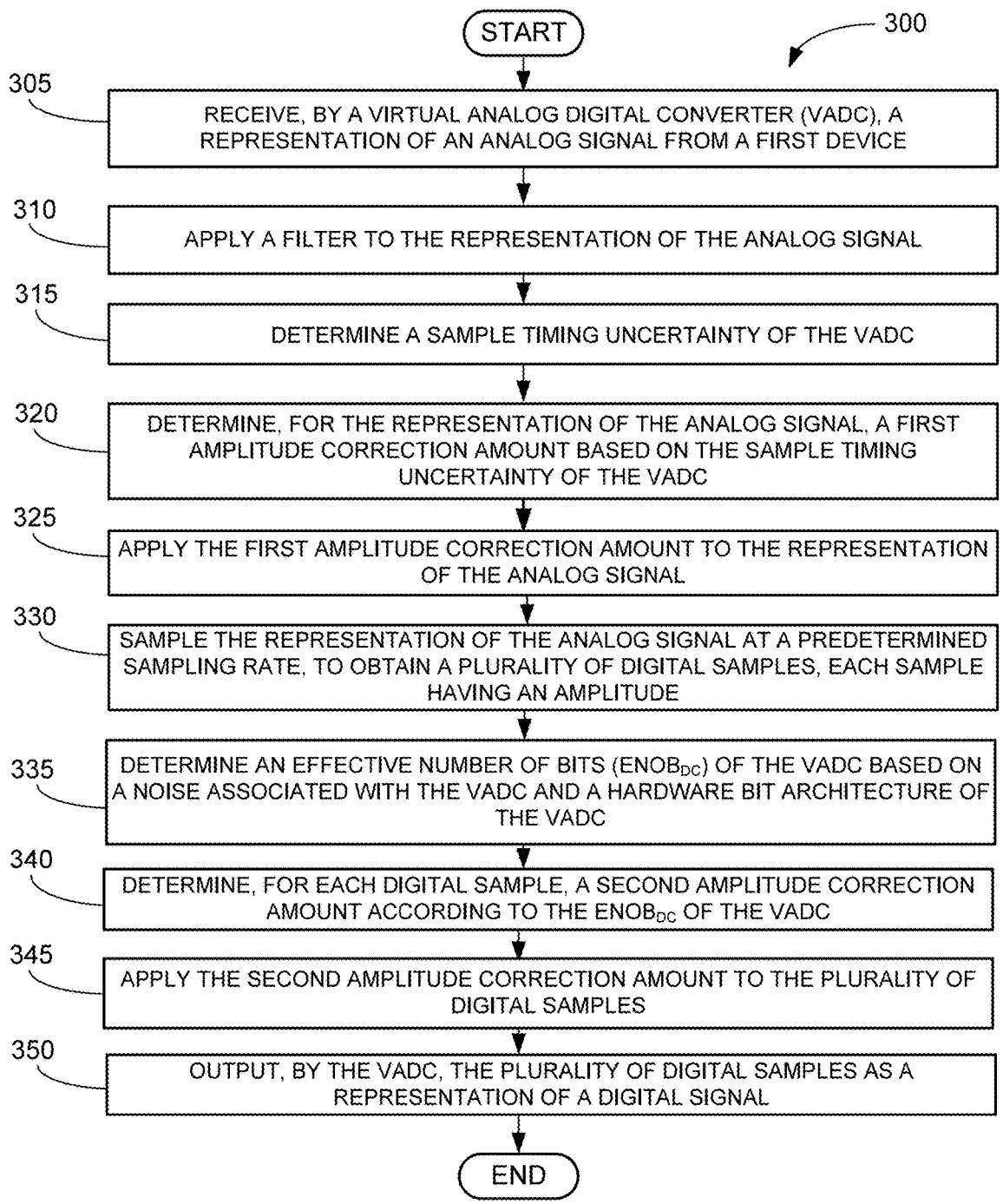
FIG. 3 is an example flow chart of a method for simulating and optimizing an analog to digital converter, in accordance with some examples of the present disclosure.

FIG. 3 illustrates an example flow chart of a method for simulating and optimizing an analog to digital converter. The method 300 may include modeling the VADC after, for example, the ADC device 140. At 305, the VADC may receive a representation of an analog signal from the first device 110. The representation of the analog signal may be a highly oversampled version of an optical signal. Further, the representation of the analog signal may be received simulation software, which may be executed on, for example, the first device 110. At 310, the VADC may apply a filter to the representation of the analog signal. The filter may be a low-pass filter. At 315, a sample timing uncertainty of the VADC may be determined. Next, at 320, a first amplitude correction amount may be determined based on the sample timing uncertainty of the VADC. At 325, the first amplitude correction amount may be applied to the representation of the analog signal.

At 330, the VADC may sample the representation of the analog signal at a predetermined sampling rate, to obtain a plurality of digital samples. Of course, each sample may have an amplitude. At 335, the VDAC may determine an effective number of bits ($ENoB_{DC}$) of the VADC based on a noise associated with the VADC and/or a hardware bit architecture of the VADC. Similar to the $ENOB_{DC}$ of VDAC mentioned above, the $ENOB_{DC}$ of the VADC may be, at most, the hardware bit architecture. Further, the $ENOB_{DC}$ of the VADC may be reduced by the effects of the noise. The noise may be related to a bandwidth of the VADC, which may be a bandwidth of about 15 to 30 GHz. As a result, the $ENOB_{DC}$ of the VADC may be within the range of about 0 to 8 bits, assuming a maximum bit architecture of 8 bits.

Next, at 340, the method may include determining, for each digital sample, a second amplitude correction amount according to the $ENoB_{DC}$ of the VADC. Further, at 345, the second amplitude correction amount to may be applied to each of the digital samples. At 350, the VADC may output the plurality of digital samples as a representation of a digital signal to the first device 110, the second device 120, and/or another device.

Figure 4A:
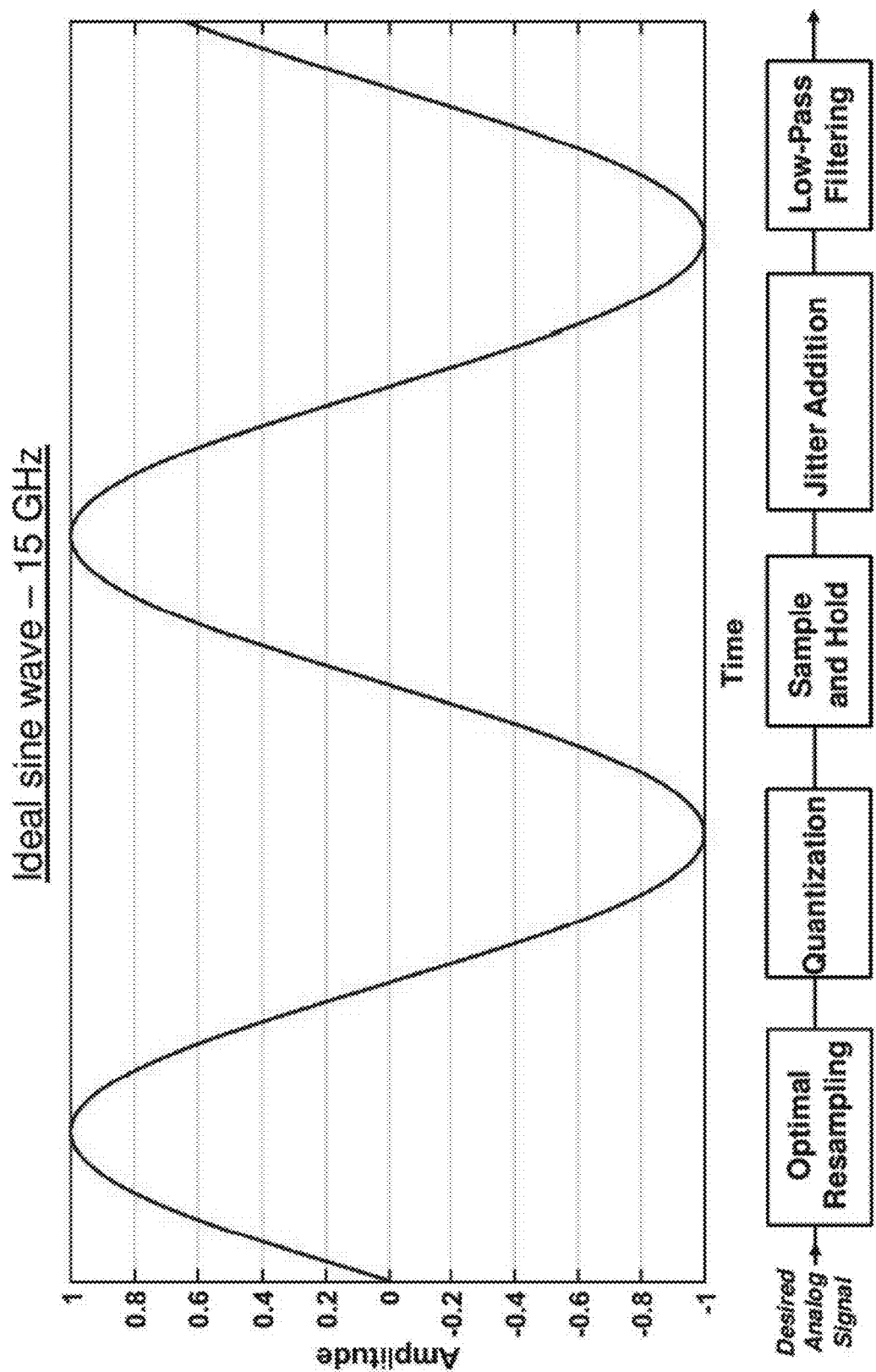
FIGS. 4A-G are graphs illustrating various stages of the method for simulating and optimizing a digital to analog converter, in accordance with some examples of the present disclosure.
Figure 4B:
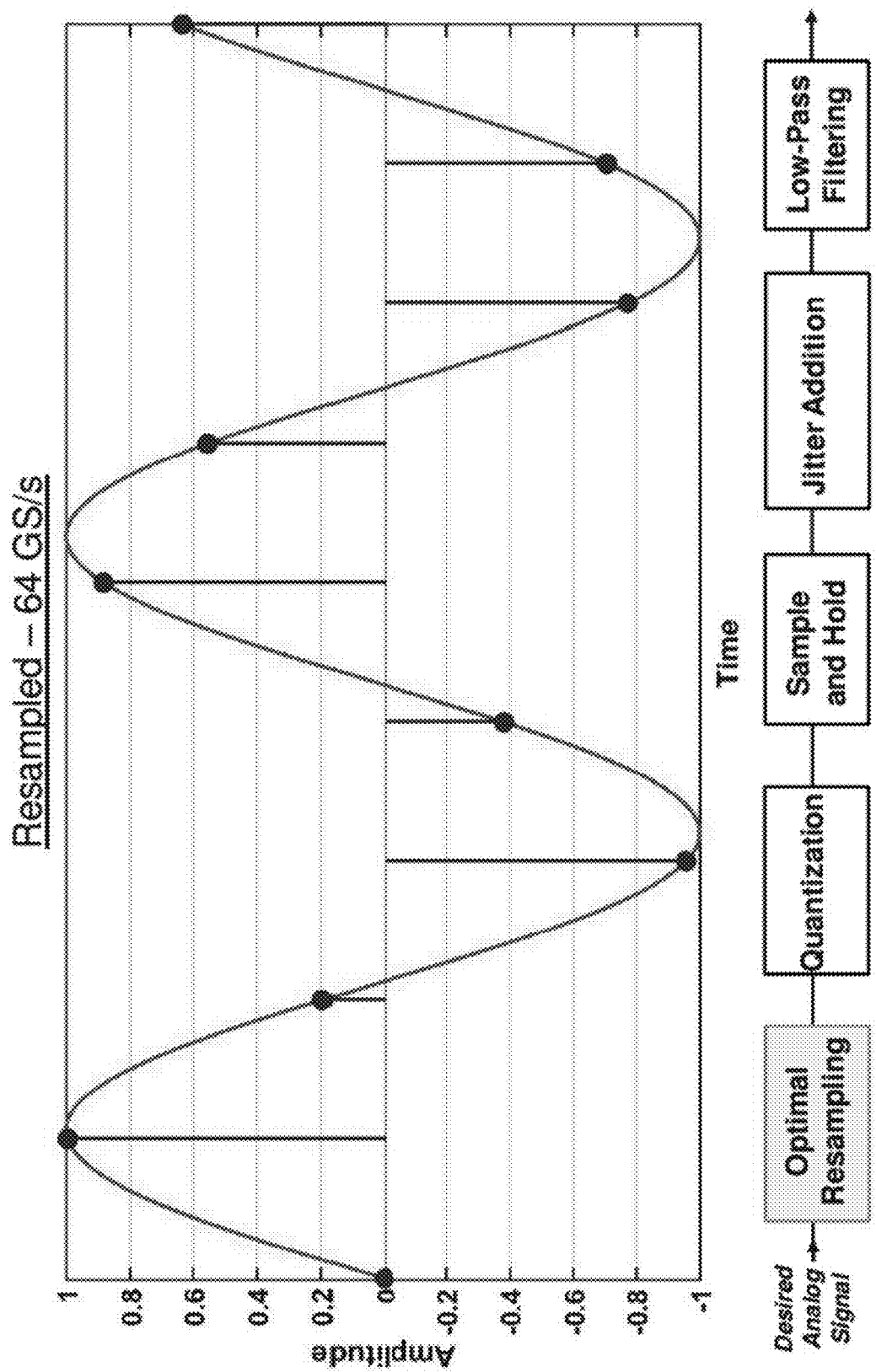
Figure 4C:
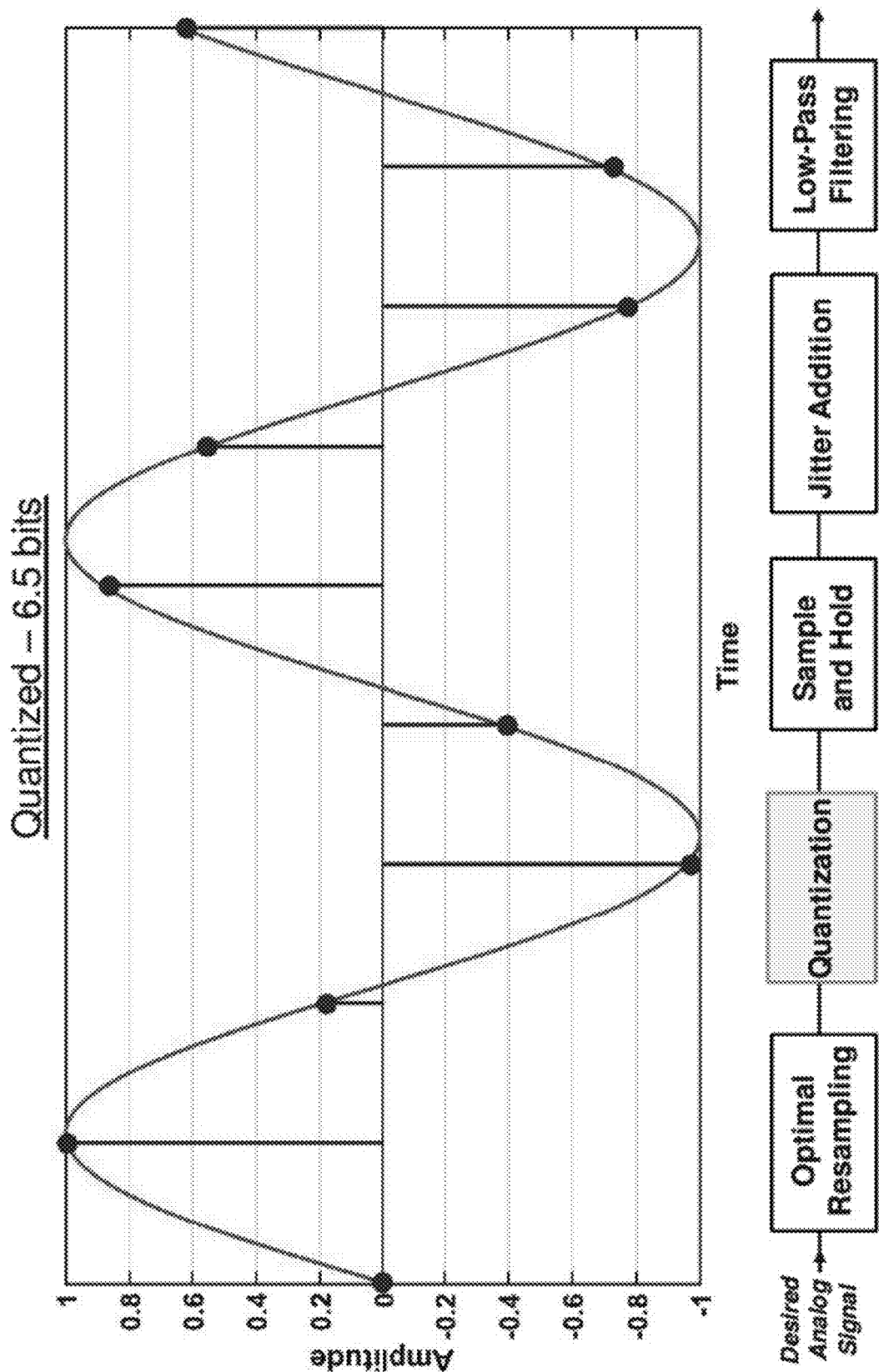
Figure 4D:
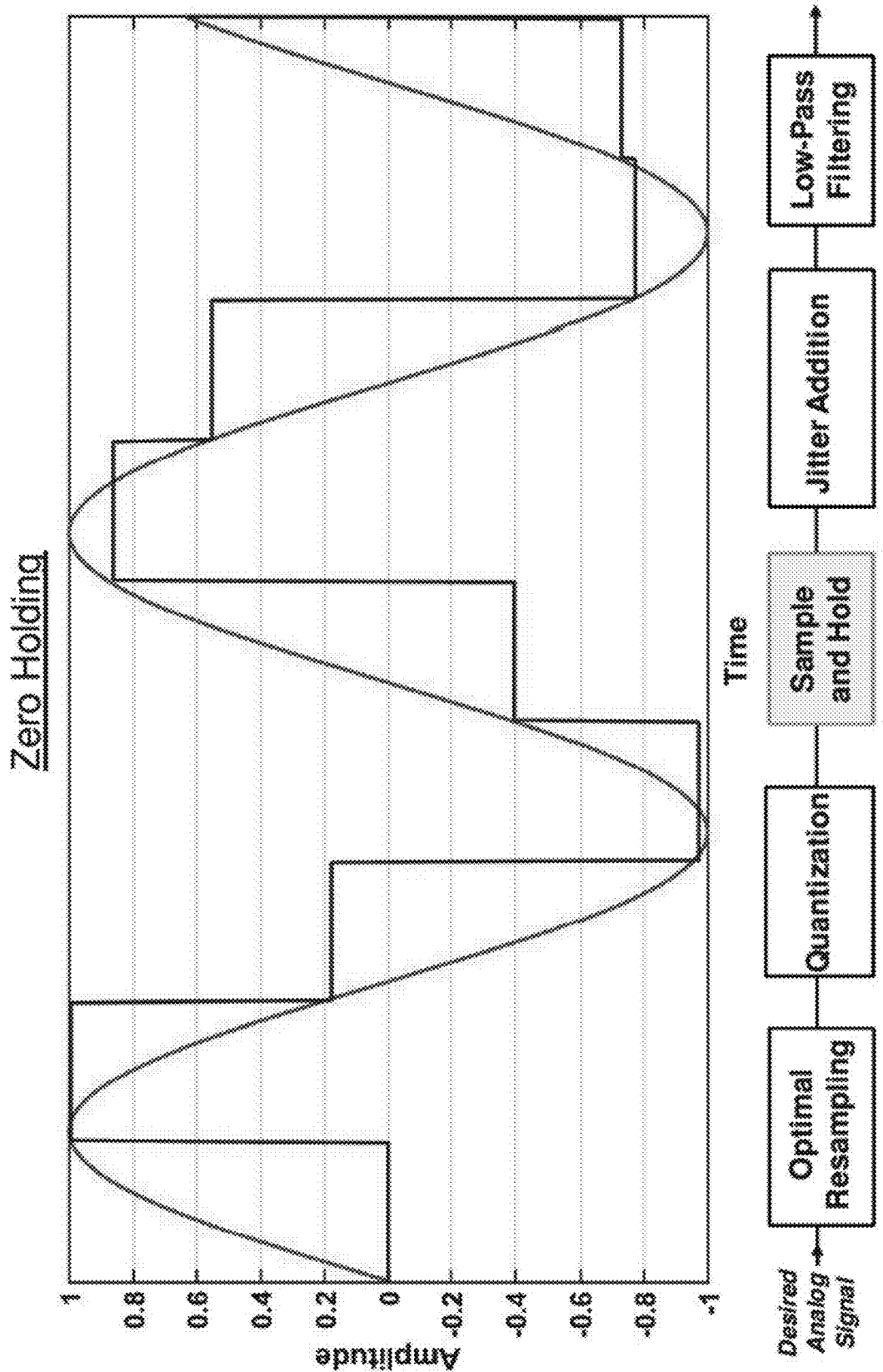

FIGS. 4A-G are graphs illustrating various stages of the method for simulating and optimizing a digital to analog converter. FIG. 4A shows the input signal (e.g., representation of the digital signal) that may be received by the VDAC. A digital preprocessing unit, such as an ASIC, may create the input signal and output the signal to the VDAC. The sampling rate of the input signal may match the sampling rate of the VDAC. Furthermore, the number of bits of the digital signal is presumed to be equal to the VDAC hardware architecture. As shown and as a non-limiting example, the input signal may be a sinusoidal wave having a frequency of about 15 GHz. Further, depending on the time, the wave may have an amplitude between −1 and 1. The input signal may also be essentially random (e.g., a communication signal). Turning to FIG. 4B, FIG. 4B illustrates the optimal resampling phase of the VDAC. Similar to step 215 discussed above, here, the amplitude for each digital word may be determined. As shown, the amplitude for each digital word may be determined at sample rate of 64 GS/s. FIG. 4C depicts the quantization process. Steps 210, 220, and 225 of FIG. 2 are indicative of the quantization process. Ultimately, quantization may each digital word within a specified range to a common value. As mentioned above, each digital word may be quantized based on the resolution of the VDAC using $ENoB_{DC}$. After each digital word is quantized, i.e., applied the first correction amount (e.g., $ENoB_{DC}$ of 6.5 bits), the sample-and-hold process illustrated by FIG. 4D may occur next. Steps 230 and 235 of FIG. 2 may be indicative of the sample-and-hold process. Therefore, the sample-and-hold process may help convert the input signal (e.g., digital signal) into the analog signal.

Figure 4E:
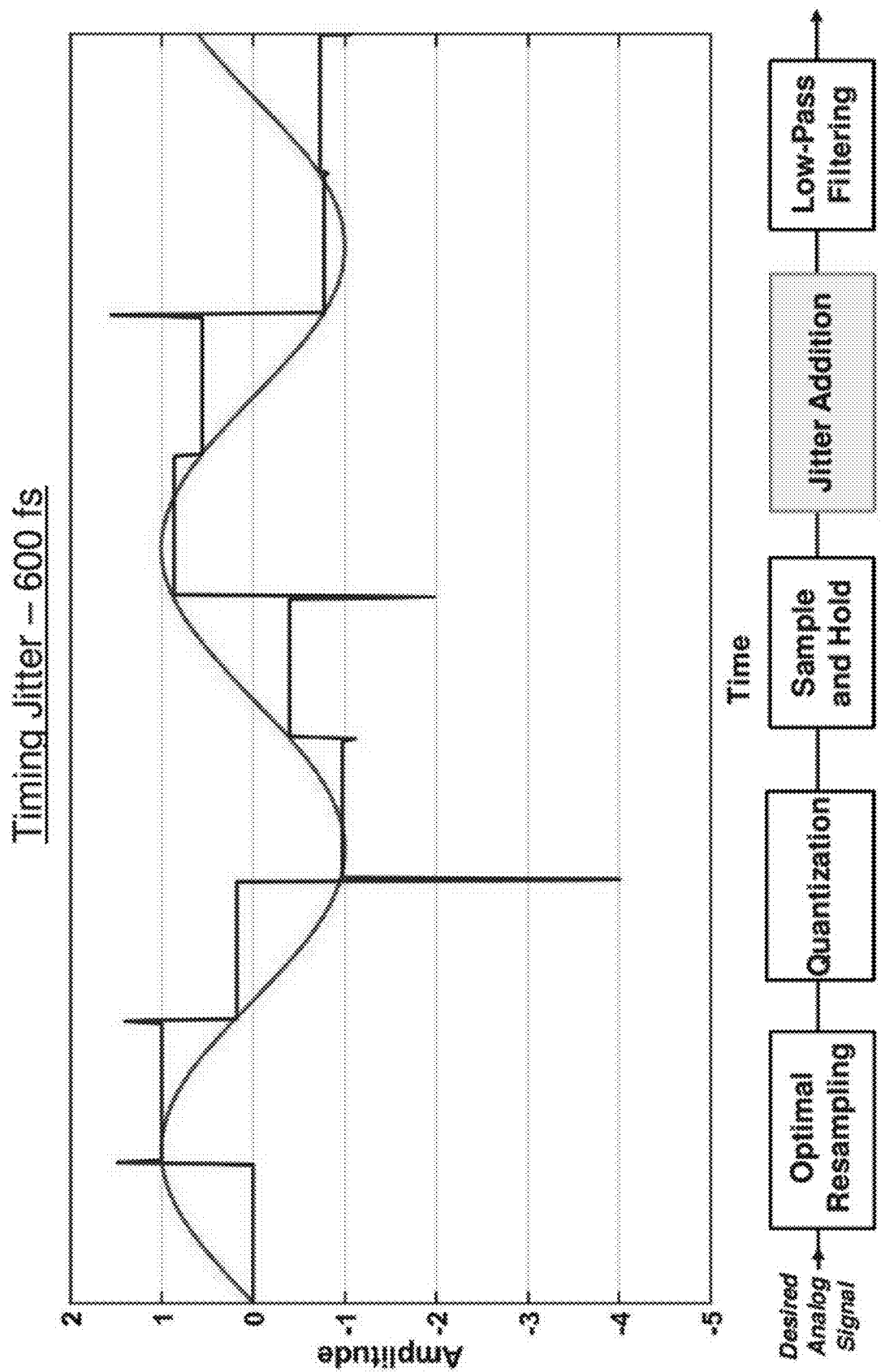
Figure 4F:
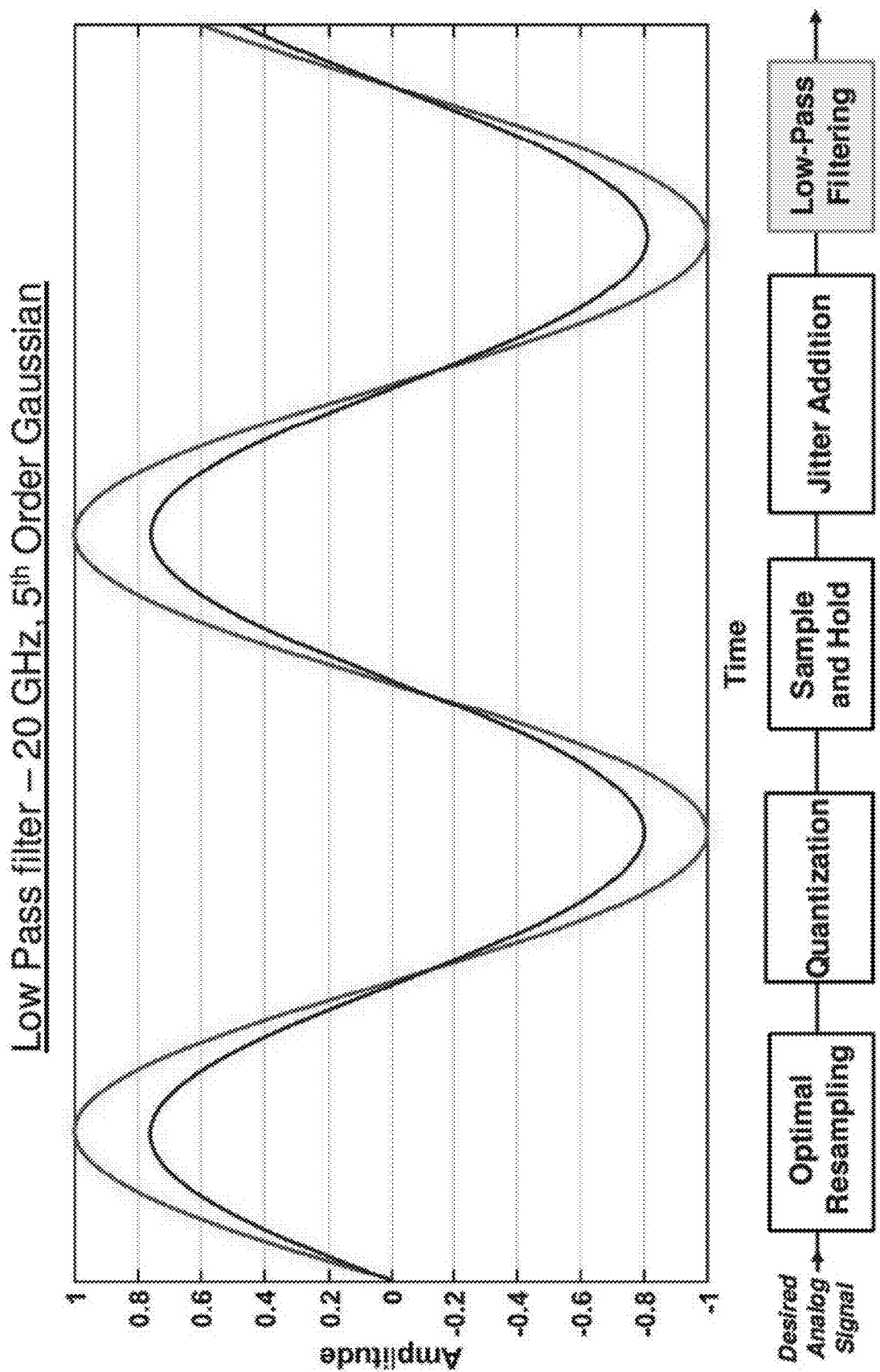
Figure 4G:
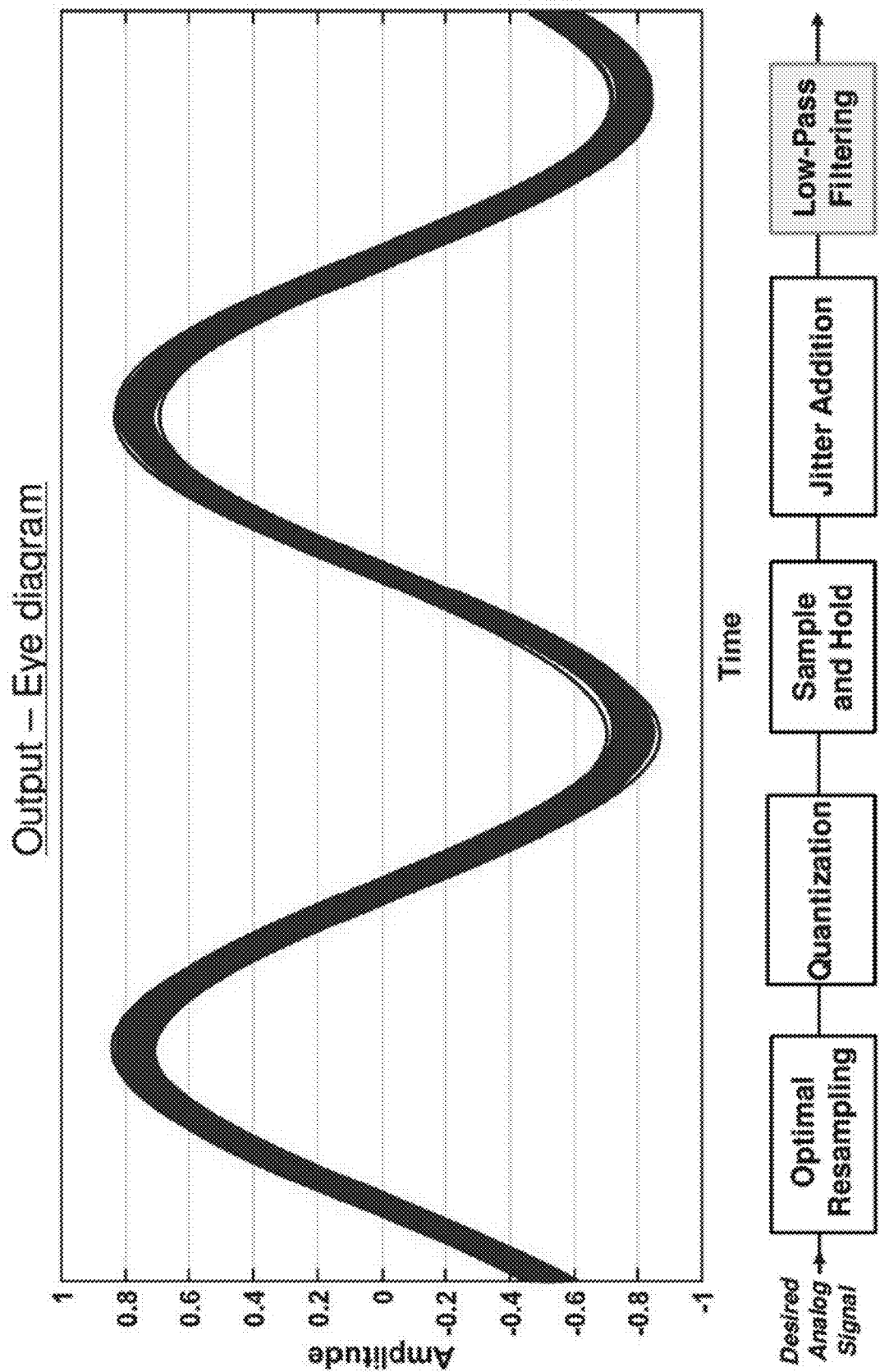

FIG. 4E shows the jitter addition process as performed by the VDAC. Steps 240-255 of FIG. 2 may be representative of the jitter addition process. The jitter addition process may be performed because the precise sampling instant varies due to imperfections of the clock, its distribution and all circuitry associated with handling the input signal, the clock and its various phases, and the process of sampling. By adding the timing jitter separately, the VDAC model perform more efficiently. The impact of adding the timing jitter may increase as the operating frequency increases. In this example, an amount of 600 fs may be added as the timing jitter addition. The second amplitude correction (e.g., timing jitter) may be determined by: (i) determining a time derivative of the representation of the digital signal; and (ii) multiplying the sample timing uncertainty and the time derivative of the representation of the digital signal to compute the second amplitude correction amount. As shown in FIG. 4F, after the representation of the analog signal is generated, the filter (low-pass filter) may be applied to the representation of analog signal. Here, the filter may be a low-pass filter having the following values: 5th-order Gaussian; and 20 GHz bandwidth. It should be noted that the order of the processes of timing jittering and applying a filter may be reversed to obtain the same or similar result. Finally, FIG. 4G shows the representation of the analog signal as outputted according to an eye diagram.

Figure 5:
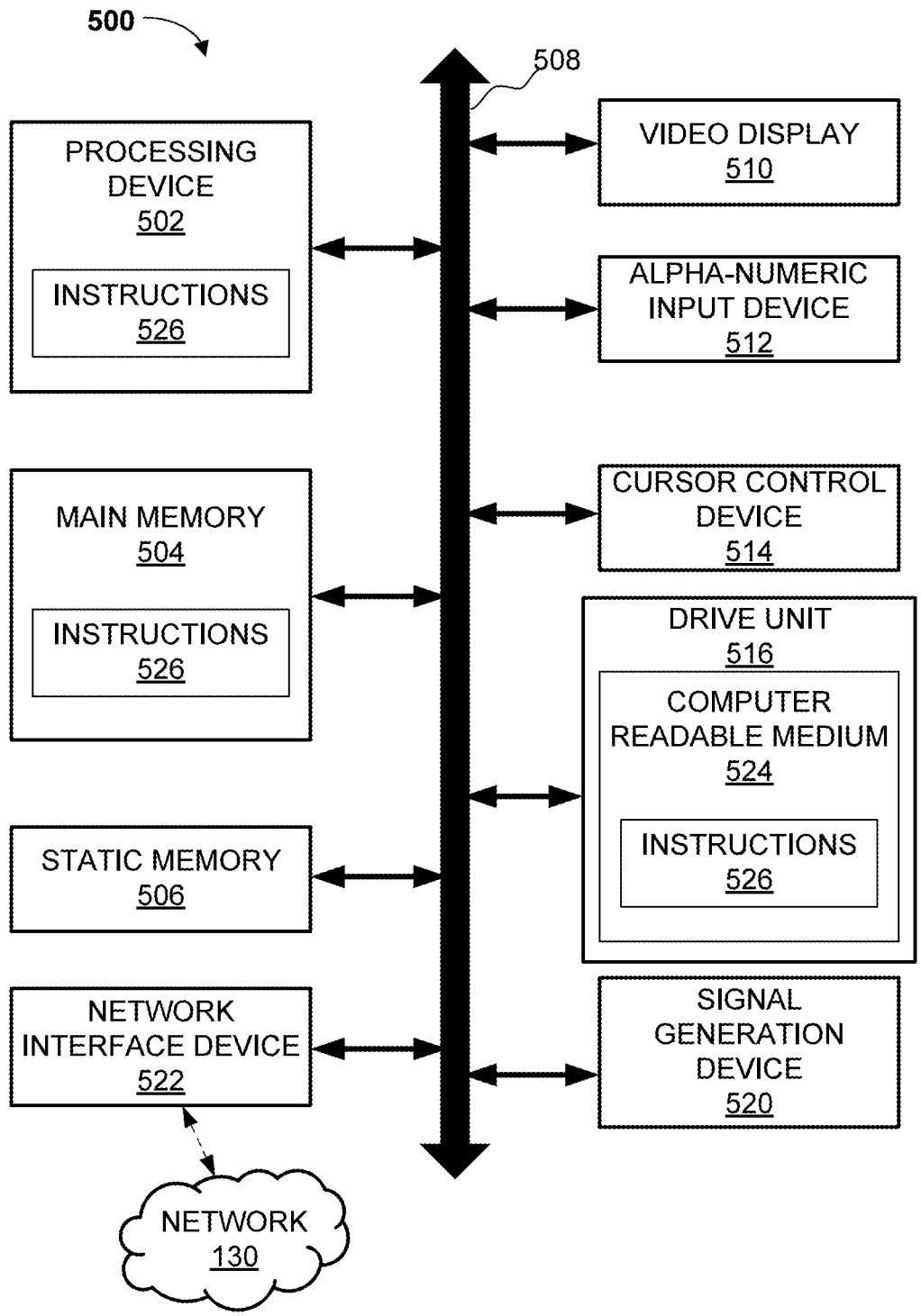
FIG. 5 is a block diagram of an example computer system for providing input signal conversion simulation and optimization, in accordance with some examples of the present disclosure.

FIG. 5 is a block diagram of an example computer system 500 that can implement certain aspects of the present disclosure. For example, the computer system 500 can be representative of the computing device 110. The computer system 500 can include a set of instructions 526 for controlling operation of the computer system 500. In some implementations, the computer system 500 can be connected (e.g., networked) to other machines in a Local Area Network (LAN), an intranet, an extranet, a satellite communications system, or the Internet. The computer system 500 can operate in the capacity of a server or a client machine in a client-server network environment, or as a peer machine in a peer-to-peer (or distributed) network environment. As non-limiting examples, the computer system 500 can be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while a single computer system 500 is illustrated, the term "machine" shall also be taken to include any collection of machines (e.g., computers) that individually or jointly execute a set (or multiple sets) of instructions to perform any one or more of the methodologies discussed herein.

The computer system 500 includes a processing device 502, a main memory 504 (e.g., read-only memory (ROM), flash memory, dynamic random-access memory (DRAM)

such as synchronous DRAM (SDRAM), etc.), a static memory 506 (e.g., flash memory, static random-access memory (SRAM), etc.), and a secondary memory 516 (e.g., a data storage device), which communicate with each other via a bus 508.

The processing device 502 represents one or more general-purpose processing devices such as a microprocessor, a microcontroller, a central processing unit, or the like. As non-limiting examples, the processing device 502 can be a reduced instruction set computing (RISC) microcontroller, a complex instruction set computing (CISC) microprocessor, a RISC microprocessor, very long instruction word (VLIW) microprocessor, a processor implementing other instruction sets, or one or more processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute the operations for electronically creating and trading derivative products based on one or more indices relating to volatility.

The computer system 500 can further include a network interface device 522, which is connectable to a network 130. The computer system 500 also can include a video display unit 510, i.e., a display (e.g., a liquid crystal display (LCD), a touch screen, or a cathode ray tube (CRT)), an alphanumeric input device 512 (e.g., a keyboard), a cursor control device 514 (e.g., a mouse), and a signal generation device 520 (e.g., a speaker).

The secondary memory 516 can include a non-transitory storage medium 524 on which is stored one or more sets of instructions 526 for the computer system 500 representing any one or more of the methodologies or functions described herein. For example, the instructions 526 can include instructions for implementing an asset tracking device including a power source and power management system or subsystem for a container or a trailer. The instructions 526 for the computer system 500 can also reside, completely or at least partially, within the main memory 504 and/or within the processing device 502 during execution thereof by the computer system 500, the main memory 504 and the processing device 502 also constituting computer-readable storage media.

While the storage medium 524 is shown in an example to be a single medium, the term "storage medium" should be taken to include a single medium or multiple media that store the one or more sets of instructions for a processing device. The term "storage medium" shall also be taken to include any medium that is capable of storing or encoding a set of instructions for execution by the machine that cause the machine to perform any one or more of the methodologies of the disclosure. The term "storage medium" shall accordingly be taken to include, but not be limited to, solid-state memories, and optical and magnetic media.

Figure 6:
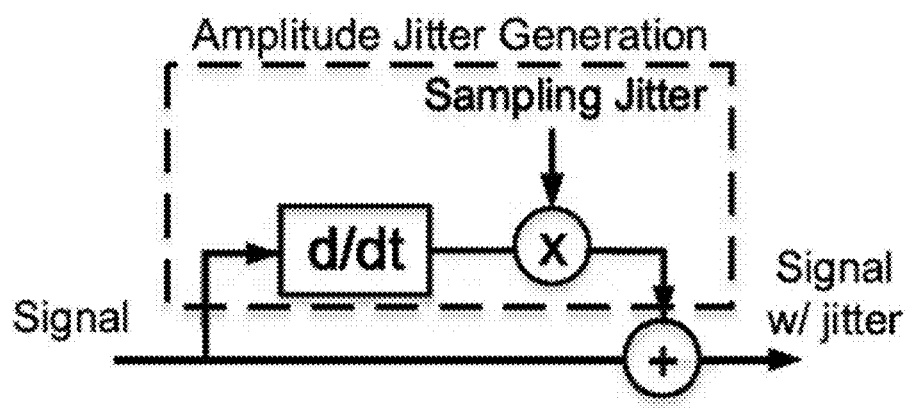
FIG. 6 is an image illustrating the jitter addition process, in accordance with some examples of the present disclosure.

FIG. 6 depicts the jitter addition process as performed by the VDAC. In a real DAC, the quantized sample passes through the sample-and-hold operation, which may add timing jitter to the signal in the time domain. Simulating this operation, however, in the VDAC may be impractical. For state-of-the-art DACs employed in optical systems, RMS timing jitter is typically on the order of 100s of femtoseconds, whereas simulations may be performed with a temporal resolution of a few picoseconds. Simulations with jitter added directly in the time domain may require commensurately finer temporal resolution making them computationally expensive and time consuming. This problem may be circumvented by determining an effective amplitude jitter resulting from the specified timing jitter. The signal after the sample-and-hold may be associated with an ideal clock and the equivalent amplitude jitter may be simply added to this representation of the analog signal. If the timing jitter ($\Delta T$) is much smaller than its sampling period, an equivalent amplitude jitter ($\Delta X$) can be calculated from the derivative of the analog signal dx/dt:

$$\Delta X = \frac{dx}{dt} \Delta T.$$

$\Delta X$ may then be added to the representation of the analog signal to simulate timing jitter.

Throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

In this description, numerous specific details have been set forth. It is to be understood, however, that implementations of the disclosed technology can be practiced without these specific details. In other instances, well-known methods, structures and techniques have not been shown in detail in order not to obscure an understanding of this description. References to "one embodiment," "an embodiment," "some embodiments," "example embodiment," "various embodiments," "one implementation," "an implementation," "example implementation," "various implementations," "some implementations," etc., indicate that the implementation(s) of the disclosed technology so described can include a particular feature, structure, or characteristic, but not every implementation necessarily includes the particular feature, structure, or characteristic. Further, repeated use of the phrase "in one implementation" does not necessarily refer to the same implementation, although it can.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain implementations of the disclosed technology have been described in connection with what is presently considered to be the most practical and various implementations, it is to be understood that the disclosed technology is not to be limited to the disclosed implementations, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain implementations of the disclosed technology, including the best mode, and also to enable any person skilled in the art to practice certain implementations of the disclosed technology, including making and using any devices or systems and performing any incorporated methods. The patentable scope of certain implementations of the disclosed technology is defined in the claims, and can include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for simulating and optimizing a digital to analog converter comprising:
   receiving, by a digital analog converter (DAC), a digital signal from a first device, the digital signal including a plurality of digital words;
   determining an effective number of bits (ENoB$_{DC}$) of the DAC based on a noise associated with the DAC and a hardware bit architecture of the DAC, wherein the noise is related to a bandwidth of the DAC;
   determining a respective amplitude for each digital word;
   determining, for each digital word, a first amplitude correction amount according to the ENoB$_{DC}$ of the DAC;
   applying the first amplitude correction amount to each respective amplitude to generate respective first corrected amplitudes;
   determining a sampling rate of the DAC;
   applying a multiple of the sampling rate of the DAC to each of the first corrected amplitudes;
   determining a timing uncertainty of the DAC;
   determining, for each digital word, a second amplitude correction amount based on the timing uncertainty of the DAC;
   applying the second amplitude correction amount to each of the respective first corrected amplitudes to generate respective second corrected amplitudes;
   generating data indicative of an analog signal based at least in part on the second corrected amplitudes;
   applying a filter to the analog signal; and
   outputting, by the DAC, the data indicative of the analog signal.

2. The method of claim 1, wherein each of the plurality of digital words has a resolution about equal to a resolution of the hardware bit architecture of the DAC.

3. The method of claim 1, wherein the digital signal comprises an electrical signal, an optical signal, a high-resolution digital signal, or a wireless signal.

4. The method of claim 1, wherein determining the second amplitude correction amount further comprises:
   determining a time derivative of the representation of the digital signal; and
   multiplying the sample timing uncertainty and the time derivative of the representation of the digital signal to compute the second amplitude correction amount.

5. The method of claim 1, wherein the digital signal is an oversampled digital signal having an oversampling factor of at least 2.

6. The method of claim 1, wherein the ENoB of the DAC is characterized by the formula:

$$ENoB = ENoB_{DC} + \log_2|H(f)| - \frac{1}{2}\log_2(1 + 6(2^{ENoB_{DC}}\pi f\sigma(\text{the second amplitude correction}))^2 - \frac{1}{2}\log_2\left(\frac{2}{f_s}\int |H(f)|^2 df\right),$$

and wherein:
   ENoB$_{DC}$ is the ENoB due to the first amplitude correction amount,
   ½ log$_2$(1+6(2$^{ENoB_{DC}}\pi f\sigma(\text{the second amplitude correction})$)$^2$ represents a decrease in the ENoB due to the second amplitude correction,
   log$_2$|H(f)| represents a decrease in the ENoB due to the low-pass filter, and $$\frac{1}{2}\log_2\left(\frac{2}{f_s}\int |H(f)|^2 df\right)$$

represents an increase in the ENoB due to the suppression of noise and distortions by the low-pass filter.

7. The method of claim 1, wherein the data indicative of the analog signal comprises a continuous signal.

8. The method of claim 1, wherein the data indicative of the analog signal comprises a plurality of discrete values.

9. A method for simulating and optimizing an analog to digital converter comprising:
   receiving, by an analog digital converter (ADC), data indicative of an analog signal from a first device;
   applying a filter to the data indicative of the analog signal;
   determining a sample timing uncertainty of the ADC;
   determining, for the data indicative of the analog signal, a first amplitude correction amount based on the sample timing uncertainty of the ADC;
   applying the first amplitude correction amount to the data indicative of the analog signal;
   sampling the data indicative of the analog signal at a predetermined sampling rate, to obtain a plurality of digital samples, each sample having an amplitude;
   determining an effective number of bits (ENoB$_{DC}$) of the ADC based on a noise associated with the ADC and a hardware bit architecture of the ADC, wherein the noise is related to a bandwidth of the ADC;
   determining, for each digital sample, a second amplitude correction amount according to the ENoB$_{DC}$ of the ADC;
   applying the second amplitude correction amount to the plurality of digital samples; and
   outputting, by the ADC, the plurality of digital samples as a digital signal.

10. The method of claim 9, wherein the each of the plurality of digital samples is a respective digital word having a resolution about equal to a resolution of a hardware bit architecture of the ADC.

11. The method of claim 9, wherein the analog signal comprises an optical signal, a wireless signal, a high resolution digital signal, or an electrical signal.

12. The method of claim 9, wherein determining the first amplitude correction amount further comprises:
   determining a derivative of the analog signal; and
   multiplying the timing uncertainty and the derivative of the analog signal to compute the first amplitude correction amount.

13. The method of claim 9, wherein the analog signal is described by an oversampled digital signal having an oversampling factor of at least 2.

14. The method of claim 9, wherein the ENoB of the ADC is characterized by the formula:

$$ENoB = ENoB_{DC} + \log_2|H(f)| - \frac{1}{2}\log_2(1+6(2^{ENoB_{DC}}\pi f\sigma(\text{the second amplitude correction}))^2$$

and wherein:
   ENoB$_{DC}$ is the ENoB characterized by the second amplitude correction, $\frac{1}{2}\log_2(1+6(2^{ENoB_{DC}\pi f\sigma(\text{the second amplitude correction})})^2$ represents a decrease in the ENoB due to the first amplitude correction, and $\log_2|H(f)|$ represents a decrease in the ENoB due to the low-pass filter.

15. The method of claim 9, wherein the data indicative of the analog signal comprises a continuous signal.

16. The method of claim 9, wherein the data indicative of the analog signal comprises a plurality of discrete values.

17. A digital to analog converter (DAC) simulating and optimizing device comprising:
a transceiver configured to receive a digital signal from a first device, the digital signal including a plurality of digital words;
a physical processor; and
physical memory, in communication with the physical processor and the transceiver, and storing instructions that, when executed, cause the DAC device to:
determine an effective number of bits ($ENoB_{DC}$) of the DAC based on a noise associated with the DAC and a hardware bit architecture of the DAC, wherein the noise is related to a bandwidth of the DAC;
determine a respective amplitude for each digital word;
determine, for each digital word, a first amplitude correction amount according to the $ENoB_{DC}$ of the DAC;
apply the first amplitude correction amount to each respective amplitude to generate respective first corrected amplitudes;
determine a sampling rate of the DAC;
apply a multiple of the sampling rate of the DAC to each of the first corrected amplitudes;
determine a timing uncertainty of the DAC;
determine, for each digital word, a second amplitude correction amount based on the timing uncertainty of the DAC;
apply the second amplitude correction amount to each of the respective first corrected amplitudes to generate respective second corrected amplitudes;
generate an analog signal based at least in part on the second corrected amplitudes;
apply a filter to the analog signal; and
output the analog signal.

18. The DAC simulating and optimizing device of claim 17, wherein the ENoB of the DAC is characterized by the formula:

$$ENoB = ENoB_{DC} + \log_2|H(f)| - $$
$$\frac{1}{2}\log_2(1+6(2^{ENoB_{DC}\pi f\sigma(\text{the second amplitude correction})})^2 - $$
$$\frac{1}{2}\log_2\left(\frac{2}{f_s}\int |H(f)|^2 df\right),$$

and wherein:
$ENoB_{DC}$ is the ENoB due to the first amplitude correction, $\frac{1}{2}\log_2(1+6(2^{ENoB_{DC}\pi f\sigma(\text{the second amplitude correction})})^2$ represents a decrease in the ENoB due to the second amplitude correction, $\log_2|H(f)|$ represents a decrease in the ENoB due to the low-pass filter, and $$\frac{1}{2}\log_2\left(\frac{2}{f_s}\int |H(f)|^2 df\right)$$

represents an increase in the ENoB due to the suppression of noise and distortions by the low-pass filter.

19. The DAC simulating and optimizing device of claim 17, wherein each of the plurality of digital words has a resolution about equal to a resolution of the hardware bit architecture of the DAC.

20. The DAC simulating and optimizing device of claim 17, wherein the digital signal comprises an electrical signal, optical signal, a high-resolution digital signal, or a wireless signal.

21. An analog to digital converter (ADC) simulating and optimizing device comprising:
a transceiver configured to receive an analog signal from a first device;
a physical processor; and
physical memory, in communication with the physical processor and the transceiver, and storing instructions that, when executed, cause the ADC device to:
receive an analog signal from the first device;
apply a filter to the analog signal;
determine a sample timing uncertainty of the ADC;
determine, for the analog signal, a first amplitude correction amount based on the sample timing uncertainty of the ADC;
apply the first amplitude correction amount to the analog signal;
sample the analog signal at a predetermined sampling rate, to obtain a plurality of digital samples, each sample having an amplitude;
determine an effective number of bits ($ENoB_{DC}$) of the ADC based on a noise associated with the ADC and a hardware bit architecture of the ADC, wherein the noise is related to a bandwidth of the ADC;
determine, for each digital sample, a second amplitude correction amount according to the $ENoB_{DC}$ of the ADC;
apply the second amplitude correction amount to the plurality of digital samples; and
output the plurality of digital samples a digital signal.

* * * * *